(12) United States Patent
Kim et al.

(10) Patent No.: US 7,724,073 B2
(45) Date of Patent: May 25, 2010

(54) CHARGE PUMP CIRCUIT

(75) Inventors: Joung-Yeal Kim, Yongin-si (KR); Young-Hyun Jun, Seoul (KR); Bai-Sun Kong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 12/287,620

(22) Filed: Oct. 10, 2008

(65) Prior Publication Data

US 2009/0134937 A1 May 28, 2009

(30) Foreign Application Priority Data

Oct. 12, 2007 (KR) ...................... 10-2007-0103145

(51) Int. Cl.
G05F 3/02 (2006.01)

(52) U.S. Cl. ..................................... 327/536

(58) Field of Classification Search ................. 327/536, 327/589, 390
See application file for complete search history.

(56) References Cited

U.S. PATENT DOCUMENTS

| | | | | |
|---|---|---|---|---|
| 6,476,666 | B1 * | 11/2002 | Palusa et al. ................. | 327/536 |
| 6,734,717 | B2 | 5/2004 | Min | |
| 7,253,675 | B2 * | 8/2007 | Aksin et al. ................... | 327/390 |
| 7,256,640 | B2 * | 8/2007 | Ucciardello et al. .......... | 327/536 |
| 7,382,177 | B2 * | 6/2008 | Cordoba et al. .............. | 327/536 |
| 7,436,241 | B2 * | 10/2008 | Chen et al. ................... | 327/536 |
| 7,583,132 | B2 * | 9/2009 | Conte et al. .................. | 327/536 |
| 2002/0130704 | A1 | 9/2002 | Myono et al. | |
| 2003/0122611 | A1 | 7/2003 | Min | |

FOREIGN PATENT DOCUMENTS

| | | |
|---|---|---|
| JP | 2002-84740 | 3/2002 |
| JP | 2003-33006 | 1/2003 |
| KR | 10-0349349 | 8/2002 |
| KR | 2002-0064207 A | 8/2002 |
| KR | 10-0404001 | 10/2003 |

(Continued)

OTHER PUBLICATIONS

Dickson, John F.; "On-Chip High-Voltage Generation . . . "; IEEE Journal of Solid-State Circuits; Jun. 1976; pp. 374-378; vol. SC-11, No. 3.

(Continued)

Primary Examiner—Hai L Nguyen
(74) Attorney, Agent, or Firm—Mills & Onello, LLP

(57) ABSTRACT

A charge pump circuit includes initialization units, each of which initializes a boost node to an initialization voltage. Boosting units each boost the boost node to a higher voltage than the initialization voltage in response to an input voltage. First and second pump circuits each include a transfer unit for transferring a voltage of the boost node to an output node and sharing the output node. The transfer unit of the first pump circuit includes two transfer transistors that are switched in response to a voltage of a control node of the first pump circuit and the voltage of the boost node of the second pump circuit. The transfer unit of the second pump circuit includes two transfer transistors that are switched in response to a voltage of a control node of the second pump circuit and the voltage of the boost node of the first pump circuit.

17 Claims, 6 Drawing Sheets

FOREIGN PATENT DOCUMENTS

| KR | 10-2004-0076336 A | 9/2004 |
|---|---|---|
| KR | 10-0632922 | 9/2006 |

OTHER PUBLICATIONS

Di Cataldo, Giuseppe, et al.; "Double and Triple Charge Pump . . . "; IEEE Transactions on Circuits and Systems; Feb. 1993; pp. 92-101; vol. 40, No. 2.

Di Cataldo, Giuseppe, et al.; "Design of an Nth Order Dickson . . . "; IEEE Transactions on Circuits and Systems; May 1996; pp. 414-418; vol. 43, No. 5.

Favrat, Pierre, et al.; "A High-Efficiency CMOS Voltage Doubler"; IEEE Journal of Solid-State Circuits; Mar. 1998; pp. 410-416; vol. 33, No. 3.

Wu, Jieh-Tsorng, et al.; "MOS Charge Pumps for Low-Voltage Operation"; IEEE Journal of Solid-State Circuits; Apr. 1998; pp. 592-597; vol. 33, No. 4.

Min, Kyeong-SiKi, et al.; "CMOS Charge Pumps Using Cross-Coupled . . . "; IEEE; 2002; pp. 545-548.

Hsieh, Ming-Chih, et al.; "A New Dual Pumping Circuit . . . "; IEEE; 2004; pp. 621-624.

Lee, Hoi, et al.; "Switching Noise and Shoot-Through . . . "; IEEE Journal of Solid-State Circuits; May 2005; pp. 1136-1146, vol. 40, No. 5.

\* cited by examiner

CHARGE PUMP CIRCUIT

CROSS-REFERENCE TO RELATED APPLICATION

This application claims the benefit of Korean Patent Application No. 10-2007-0103145, filed in the Korean Intellectual Property Office on Oct. 12, 2007, the contents of which are hereby incorporated herein by reference in their entirety.

BACKGROUND OF THE INVENTION

1. Field of the Invention

The present invention relates to a charge pump circuit, and more particularly, to a charge pump circuit for generating a boosted voltage that is higher than a low internal voltage.

2. Description of the Related Art

With the rapid development of micromachining technology, a power supply voltage is being continuously decreased to reduce power consumption. In order to meet demand for high-speed systems capable of high-speed digital communication, high-quality/high-speed display, and high-capacity storage, an analog block and a digital block within a system use a plurality of power supply voltages.

However, since some semiconductor devices or some circuits thereof require a high voltage, depending on their operation characteristics, the need exists for a charge pump circuit or a voltage boosting circuit for generating a higher voltage than a power supply voltage within a semiconductor device.

The charge pump circuit can obtain a high voltage by performing a boosting operation based on the law of conservation of electric charge after charging a voltage in an initialization state and transferring the charged voltage to an output stage. The charge pump circuit is divided into two types, which include an N-type Metal-Oxide-Semiconductor (NMOS) voltage-doubler type for sequentially performing initialization, boosting, and transfer operations using NMOS transistors as charge transfer transistors and a cross-couple type for boosting one of two inputs having opposite phases, automatically initializing the other input, and transferring a boosted input voltage using an initialized low level of the other input.

There is a large difference between the two types. That is, the NMOS voltage-doubler type charge pump circuit additionally boosts a gate voltage using the NMOS transfer transistor in order to smoothly transfer the electric charge of an input stage to the output stage, whereas the cross-coupled charge pump circuit uses a P-type Metal-Oxide-Semiconductor (PMOS) transfer transistor, performs a control operation using another input stage in order to improve the transfer efficiency per area and obtain a high output voltage, and constantly maintains a bulk voltage of the PMOS transistor at a maximum level.

FIG. 1 is a circuit diagram of a conventional NMOS voltage-doubler type charge pump circuit. The charge pump circuit includes an inverter IN, an initialization transistor N_in, an initialization control transistor N_inc, a transfer transistor N_tr, a transfer control transistor N_trc, an initialization control capacitor Cb1, a transfer control capacitor Cb2, a pump capacitor Cp, and an output capacitor Co. The initialization transistor N_in, the initialization control transistor N_inc, the transfer transistor N_tr, and the transfer control transistor N_trc are all NMOS transistors.

Operation of the conventional NMOS voltage-doubler charge pump circuit will be described with reference to FIG. 1.

First, the initialization control capacitor Cb1 and the initialization control transistor N_inc function to initialize the pump capacitor Cp at as high a voltage as possible upon initialization. The transfer control capacitor Cb2 and the transfer control transistor N_trc function to transfer as much electric charge as possible from the pump capacitor Cp to an output terminal when a transfer operation is performed.

When a positive input voltage VIN having a low level is initially applied to an input terminal, a phase is inverted to a high level through the inverter IN and the voltage of the initialization control capacitor Cb1 is raised. Since the initialization transistor N_in is turned on by raising the voltage of the gate terminal thereof, one side of the pump capacitor Cp is grounded by VIN and an internal voltage VINT is transferred to the other side of the pump capacitor Cp, such that the initialization operation is performed.

When a level of the internal voltage VINT applied to the gate terminal of the initialization control transistor N_inc is lower than a difference between a gate voltage and a threshold voltage, the initialization control transistor N_inc is turned off. When an inverted level of the positive input voltage VIN applied to the gate terminal of the transfer control transistor N_trc is higher than the difference between the gate voltage and the threshold voltage, the transfer control transistor N_trc is turned on.

When the initialized internal voltage VINT at the other side of the pump capacitor Cp is applied to the gate terminal of the transfer transistor N_tr through the transfer control transistor N_trc, the transfer transistor N_tr is turned off.

When the input voltage is increased after the initialization operation, the level at the one side of the pump capacitor Cp is raised from the ground voltage by the increased voltage. According to the law of conservation of electric charge, the level at the other side of the pump capacitor Cp is also raised from the initialized internal voltage VINT by the increased voltage, such that a boosted voltage VPP is generated by the pumping operation.

Since the boosted voltage applied to the gate terminal of the initialization control transistor N_inc is higher than the difference between the gate voltage and the threshold voltage, the initialization control transistor N_inc is turned on and the initialization transistor N_in is turned off by applying the internal voltage VINT to its gate terminal.

In contrast, when the increased input voltage VIN is applied to the gate terminal of the transfer transistor N_tr, the transfer transistor N_tr is turned on. The boosted voltage is transferred to the output terminal and is charged in the output capacitor Co.

However, in the conventional NMOS voltage-doubler type charge pump circuit, a maximum value of an output voltage capable of being generated by an NMOS gate voltage becomes the difference (Vg–Vth) between the gate voltage and the threshold voltage. Since an NMOS bias voltage is low, the charge pump circuit approaches a cut-off region where no current flows and current supply capability thereof is degraded.

In general, the charge pump circuit may use a multi-stage charge pump structure to easily control the internal voltage and the timing at which a target boosted-voltage is output. When an initialization time and a boosting and transfer time overlap in the same stage of the conventional NMOS voltage-doubler type charge pump circuit, unwanted electrical discharge occurs and efficiency rapidly deteriorates. Since the associated times are conventionally controlled using a delay unit, a precise control operation should be performed in consideration of voltage variation. However, it becomes difficult to control the timing when the number of stages increases.

FIG. 2 is a circuit diagram of a conventional cross-coupled charge pump circuit. The charge pump circuit includes first and second initialization transistors N_in1 and N_in2, first and second transfer transistors P_tr1 and P_tr2, first and second boost capacitors Cb1 and Cb2, and an output capacitor Co. The first and second initialization transistors N_in1 and N_in2 are NMOS transistors, and the first and second transfer transistors P_tr1 and P_tr2 are PMOS transistors.

Operation of the conventional cross-coupled charge pump circuit will be described with reference to FIG. 2.

When a positive input voltage VIN having a low level is initially applied to a first input terminal, one side of the first boost capacitor Cb1 is grounded and, simultaneously, the second transfer transistor P_tr2 is turned on. When a negative input voltage VINB having a high level is applied to a second input terminal, one side of the second boost capacitor Cb2 is at a high voltage and, simultaneously, the first initialization transistor N_in1 serving as the NMOS transistor is turned on when the voltage is applied to its gate terminal. An internal voltage VINT is transferred to the other side of the first boost capacitor Cb1 so that the first input terminal side is initialized.

At this time, since the negative input voltage VINB having a high level is applied to the gate terminal of the first transfer transistor P_tr1, the first transfer transistor P_tr1 is turned off.

When the first initialization transistor N_in1 is turned off after initialization of the first input terminal side, and the positive input voltage VIN is increased, the voltage at the one side of the first boost capacitor Cb1 is raised from the ground voltage by the increased voltage. According to the law of conservation of electric charge, the voltage at the other side of the first boost capacitor Cb1 is also raised from the initialized internal voltage VINT by the increased voltage, such that a boosted voltage is generated by the pumping operation.

When the negative input voltage VINB is decreased to a relatively low level and is applied to the gate terminal of the first transfer transistor P_tr1, the first transfer transistor P_tr1 is turned on and the pumped boosted voltage is transferred to the output terminal and charged in the output capacitor Co.

In contrast, when the positive input voltage VIN is increased, the negative input voltage VINB is decreased to a relatively low level. The first transfer transistor P_tr1 is turned on simultaneously when one side of the second boost capacitor Cb2 is grounded. When the input voltage having the high level is applied to the gate terminal of the second initialization transistor N_in2, the second initialization transistor N_in2 serving as the NMOS transistor is turned on and the internal voltage VINT is transferred to the other side of the second boost capacitor Cb2, such that the second input terminal side is initialized.

However, when the conventional cross-coupled charge pump circuit boosts one of the two input voltages having opposite phases, the other voltage is automatically initialized. Since the charge pump circuit has a structure for transferring the electric charge of the boosted voltage with another initialized voltage, waveforms of the two input voltages cross over and a shoot-through current is generated in an interval of the same phase. When the waveforms of the two input voltages overlap in the same phase, the electric charge of the output terminal flows backward to an internal power supply terminal, such that efficiency may be significantly lowered by a leakage current.

For example, if a time when the positive input voltage VIN transitions from the high level to the low level overlaps a time when the negative input voltage VINB transitions from the low level to the high level, the second initialization transistor N_in2 at the negative input voltage VINB side is turned on, such that the electric charge stored in the second boost capacitor Cb2 at the second input terminal side is not transferred to the output terminal and flows into the internal power supply terminal.

When the positive input voltage VIN does not transition to the high level due to a signal delay and the negative input voltage VINB transitions to the low level, voltages of first and second boost nodes NO1 and NO2 are partially decreased by the effect of bulk forward-bias. Accordingly, the first and second transfer transistors P_tr1 and P_tr2 are weakly turned on. The electric charge stored in the output capacitor Co partially flows backward to the first and second boost nodes NO1 and NO2.

Therefore, a voltage charged in the output capacitor Co is charged in the first and second boost capacitors Cb1 and Cb2. Since the voltage has a high level, the first and second initialization transistors N_in1 and N_in2 are turned on. In this case, since a leakage current is generated, the voltage of the output terminal is not maintained at a pumped boosted voltage.

In contrast, since the conventional cross-coupled charge pump circuit uses two inputs having opposite phases, transistor characteristics are irregularly degraded due to a high electric field.

That is, when the output voltage VOUT reaches a target voltage, a charge pumping operation is stopped and an increase of the output voltage VOUT is stopped. Since the positive input voltage VIN and the negative input voltage VINB conventionally have opposite phases, the charge pumping operation at one input terminal is stopped and the other input terminal is maintained at the high level. Also in a standby state in which the internal power supply voltage is applied but a semiconductor circuit itself does not operate, one input terminal of the positive input voltage VIN and the negative input voltage VINB should be maintained at the high level.

Specifically, since a direct current (DC) generator selectively operates only in a required interval, this state may continue for a long time. Since a transistor to which the high electric field is applied is fixed and the degradation effect is focused on the transistor, mismatch may be caused by degradation in a circuit, like the cross-coupled charge pump circuit, in which matching between both input terminals is important. Consequently, the performance of the charge pump circuit may be degraded.

SUMMARY OF THE INVENTION

The present invention provides a charge pump circuit that can generate a higher voltage than a boosted voltage and that can stably output a boosted voltage by overcoming a problem of leakage current in an output stage, a limitation in use due to continuation of a standby state, and mismatch due to degradation.

According to an aspect of the present invention, there is provided a charge pump circuit including: initialization units each initializing a boost node to an initialization voltage upon initialization; boosting units each boosting the boost node to a higher voltage than the initialization voltage in response to an input voltage upon charge pumping; and first and second pump circuits each including a transfer unit for transferring a voltage of the boost node to an output node and sharing the output node. The transfer unit of the first pump circuits includes two transfer transistors that are serially connected between the boost node and the output node and switched in response to a voltage of a control node of the first pump circuit and the voltage of the boost node of the second pump circuit. The transfer unit of the second pump circuit includes two transfer transistors that are serially connected between the boost node and the output node and switched in response to a voltage of a control node of the second pump circuit and the voltage of the boost node of the first pump circuit.

The charge pump circuit may further include: bulk bias units each preventing bulk forward-bias effect of a PMOS transistor by raising a bulk voltage of the transfer unit by a predetermined level; and an output unit that charges a boosted voltage in an output capacitor by receiving the boosted voltage from the boosting unit and simultaneously externally outputs the boosted voltage.

Each of the initialization units may include: an initialization transistor that is turned on in response to an initially inverted input voltage and initializes the boost node by transferring the initialization voltage to the boost node; and an initialization control transistor that is turned on in response to the voltage of the boost node and controls the initialization transistor to be turned on or off by applying the initialization voltage to a control terminal of the initialization transistor.

Each of the boosting units may include: an inverter that inverts a voltage by receiving the input voltage; a first boost capacitor that receives and charges the inverted input voltage and controls the initialization transistor to be turned on or off by applying the charged input voltage to the control terminal of the initialization transistor; and a second boost capacitor that receives and charges the input voltage at a first side of the second boost capacitor, and charge-pumps a voltage at a second side of the second boost capacitor from the initialization voltage to the boosted voltage raised by an increased voltage.

The second boost capacitor may raise the voltage at the second side of the second boost capacitor by the increased voltage from the initialization voltage according to the law of conservation of electric charge when the voltage at the first side of the second boost capacitor is raised by the increased voltage if the input voltage is increased.

The transfer unit may include: a first transfer transistor that is turned on in response to the voltage of the control node and transfers the voltage of the boost node; and a second transfer transistor that is turned on in response to the voltage of the boost node of an opposite pump circuit of the first and second pump circuits and transfers the voltage of the boost node from the first transfer transistor to the output unit.

The first and second transfer transistors may be PMOS transistors.

The first transfer transistor may be an NMOS transistor to control a phase of the input voltage to be inverted.

Each of the bulk bias units may include: a third transfer transistor that is turned on in response to the voltage of the control node and transfers the voltage of the boost node; and a fourth transfer transistor that is turned on in response to a voltage of a boost node of an opposite pump circuit of the first and second pump circuits and transfers the voltage of the boost node from the third transfer transistor to bulk terminals of the first and second transfer transistors.

The third and fourth transfer transistors may be PMOS transistors.

The third transfer transistor may be an NMOS transistor to control a phase of the input voltage to be inverted.

In the first and second pump circuits, one of the first and second pump circuits may perform a charge pumping operation to the boosted voltage when the other of the first and second pump circuits performs an initialization operation, and the one of the first and second pump circuits may perform the initialization operation when the other of the first and second pump circuits performs the charge pumping operation to the boosted voltage.

In one embodiment, input voltages have opposite phases when the charge pumping operation to the boosted voltage is performed, and have the same phase when in a steady state.

When overlap occurs since one of the input voltages does not transition to a low level and the other transitions to a high level, the first transfer transistor of the transfer unit may be turned on and the second transfer transistor may be turned off, thereby preventing electric charge stored in the output capacitor from leaking to the boost node.

When overlap occurs since the one of the input voltages does not transition to the high level and the other transitions to the low level, the first transfer transistor of the transfer unit may be turned off and the second transfer transistor may be turned on, thereby preventing electric charge stored in the output capacitor from leaking to the boost node.

When a time when one of two input voltages transitions from the high level to the low level overlaps a time when the other of the two input voltages transitions from the low level to the high level, the transfer unit may prevent the electric charge stored in the output capacitor from leaking to the boost node by setting turn-on times of the first and second transfer transistors to be different from each other.

Each of the initialization units may include: an initialization transistor that is initially turned on in response to the voltage of the boost node of an opposite pump circuit of the first and second pump circuits, and initializes the boost node by transferring the initialization voltage; and a transfer control transistor that is turned on in response to the voltage of the boost node and controls a transfer of the voltage of the boost node by transferring the initialization voltage to the transfer unit.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

A charge pump circuit according to example embodiments of the present invention will be described with reference to the accompanying drawings.

Figure 1:
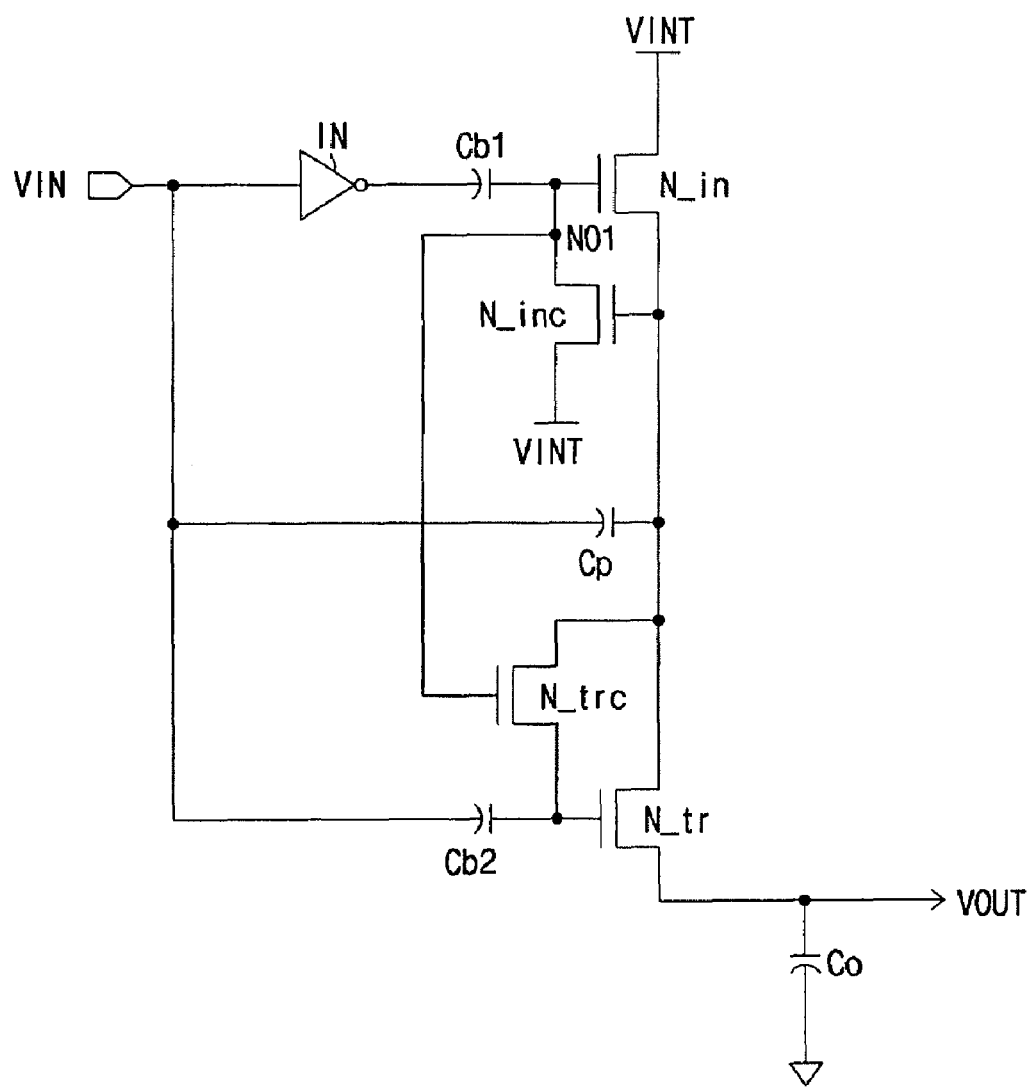
FIG. 1 is a circuit diagram of a conventional NMOS voltage-doubler type charge pump circuit.
Figure 2:
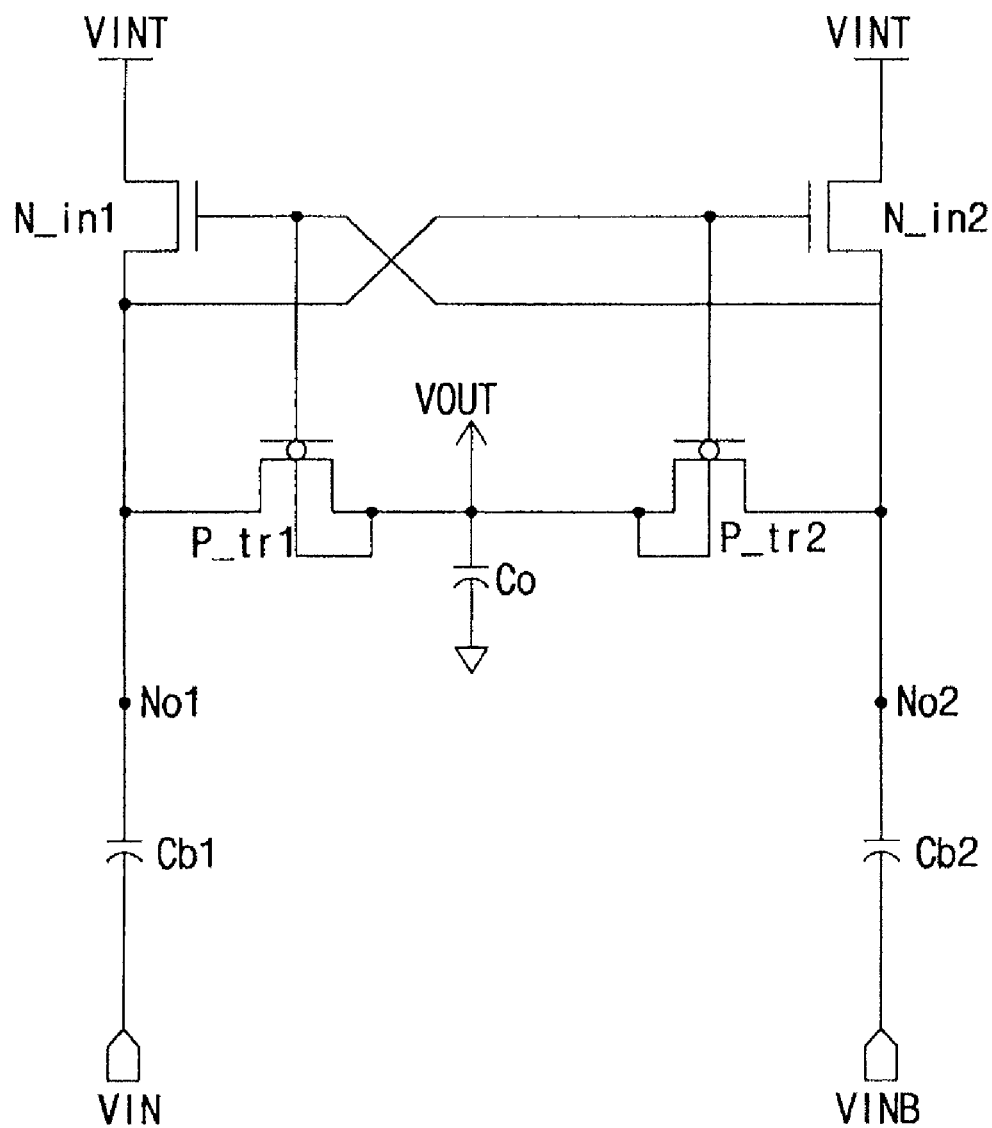
FIG. 2 is a circuit diagram of a conventional cross-coupled charge pump circuit.
Figure 3A:
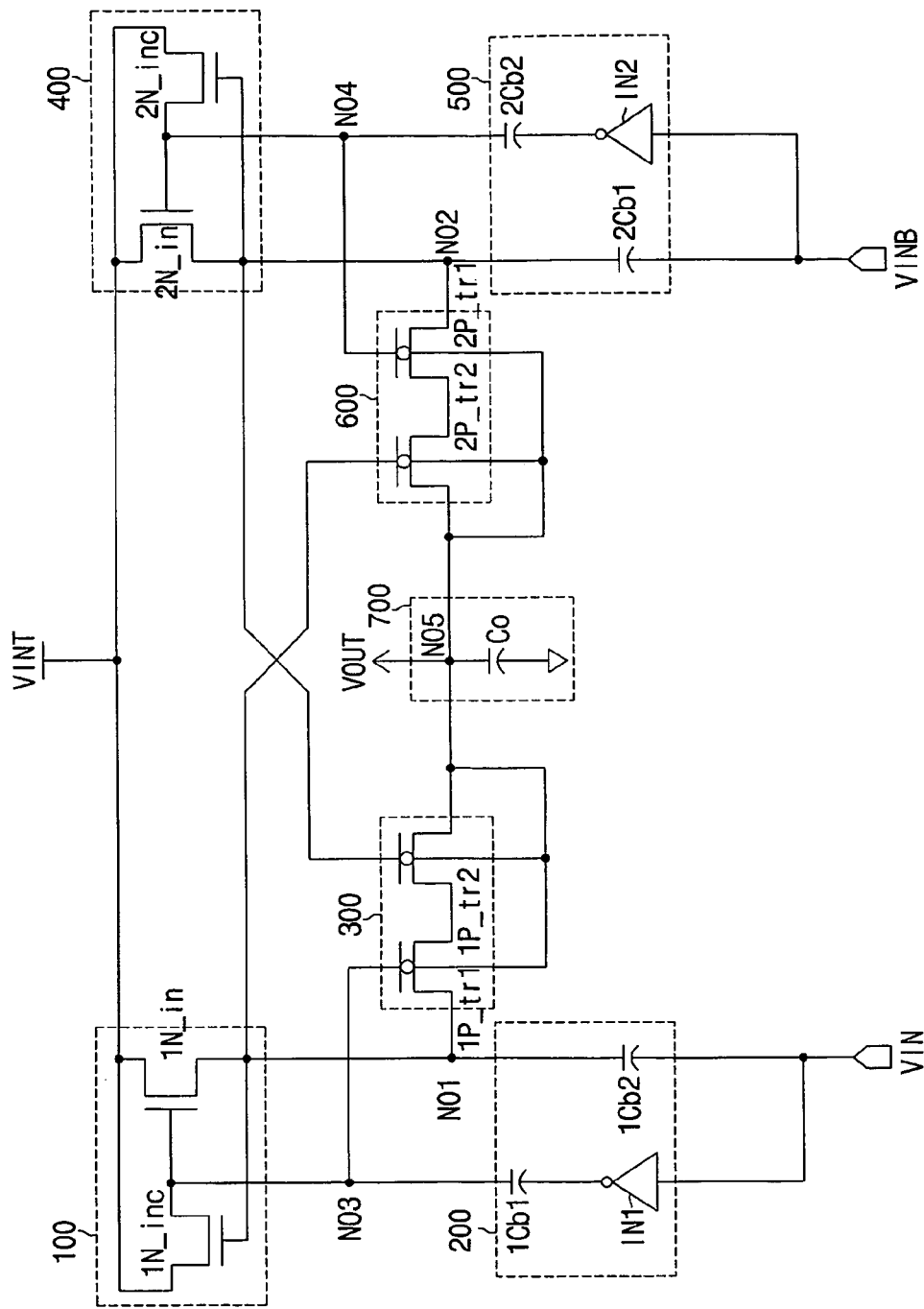
FIG. 3A is a conceptual circuit diagram of a charge pump circuit according to an example embodiment of the present invention.

FIG. 3A is a conceptual circuit diagram of a charge pump circuit according to an example embodiment of the present invention. The charge pump circuit includes first and second initialization units 100 and 400 configured with initialization transistors 1N_in and 2N_in and initialization control transistors 1N_inc and 2N_inc; first and second boosting units 200 and 500 configured with first and second boost capacitors 1Cb1, 1Cb2, 2Cb1, and 2Cb2 and inverters IN1 and IN2; first and second transfer units 300 and 600 configured with first and second transfer transistors 1P_tr1, 1P_tr2, 2P_tr1, and 2P_tr2; and an output unit 700 configured with an output capacitor Co. The initialization transistors 1N_in and 2N_in and the initialization control transistors 1N_inc and 2N_inc are NMOS transistors. The first and second transfer transistors 1P_tr1, 1P_tr2, 2P_tr1, and 2P_tr2 are PMOS transistors.

Figure 3B:
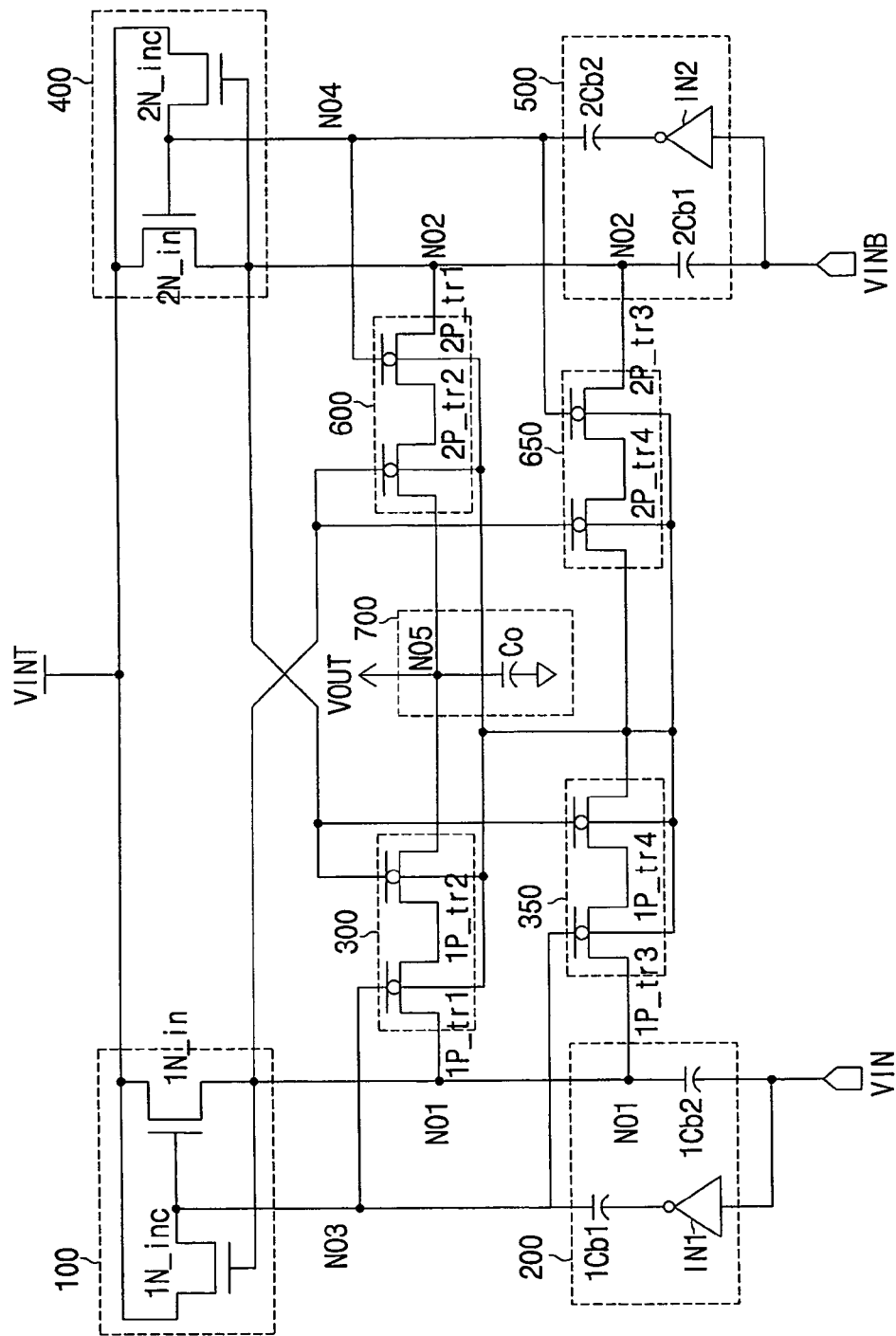
FIG. 3B is an actual circuit diagram of a charge pump circuit according to an example embodiment of the present invention.

FIG. 3B is an actual circuit diagram of a charge pump circuit according to an example embodiment of the present invention. The charge pump circuit includes first and second bulk bias units 350 and 650 configured with third and fourth transfer transistors 1P_tr3, 1P_tr4, 2P_tr3, and 2P_tr4 added to the conceptual charge pump circuit of FIG. 3A.

The functions of blocks of the charge pump circuit according to the example embodiment of the present invention will be described with reference to FIGS. 3A and 3B.

The first and second initialization units 100 and 400 receive an internal voltage VINT and initialize a boost voltage from a ground voltage state to the internal voltage VINT in response to two input voltages VIN and VINB having opposite phases.

The first and second boosting units 200 and 500 receive the two input voltages VIN and VINB having the opposite phases and raise a boost voltage by an increased voltage of each input voltage from the internal voltage VINT under control of the first and second initialization units 100 and 400, thereby pumping the electric charge to the boosted voltage.

The first and second transfer units 300 and 600 transfer charge-pumped boosted voltages from the first and second boosting units 200 and 500 in response to the two input voltages VIN and VINB.

The first and second bulk bias units 350 and 650 increase bulk voltages of the first and second transfer units 300 and 600 by a predetermined level, thereby preventing the effect of bulk forward-bias of the PMOS transistors.

The output unit 700 receives the boosted voltage from the first and second transfer units 300 and 600 and externally outputs the boosted voltage simultaneously when the boosted voltage is charged in the output capacitor Co.

Operation of the charge pump circuit according to the example embodiment of the present invention will be described with reference to FIGS. 3A and 3B.

When the positive input voltage VIN having the low level is initially applied to a first input terminal, one side of the second boost capacitor 1Cb2 of the first boosting unit 200 is grounded. The positive input voltage VIN is phase-inverted to the high level by the inverter IN1 and applied to one side of the first boost capacitor 1Cb1 of the first boosting unit 200. The phase-inverted voltage is applied to the gate terminal of the initialization transistor 1N_in of the first initialization unit 100 via a first control node NO3.

Accordingly, the initialization transistor 1N_in of the first initialization unit 100 is turned on and the internal voltage VINT is transferred to the other side of the second boost capacitor 1Cb2 of the first boosting unit 200, such that the first input terminal side is initialized.

At this time, the first transfer transistor 1P_tr1 of the first transfer unit 300 receives the positive input voltage VIN having the high level through its gate terminal and is turned off. The second transfer transistor 1P_tr2 of the first transfer unit 300 receives the negative input voltage VINB having the high level through its gate terminal and is turned off.

When the positive input voltage VIN is increased after the initialization of the first input terminal side, the phase is inverted to the low level by the inverter IN1. The phase-inverted voltage is applied to one side of the first boost capacitor 1Cb1 of the first boosting unit 200, and to the gate terminal of the initialization transistor 1N_in of the first initialization unit 100 and the gate terminal of the first transfer transistor 1P_tr1 of the first transfer unit 300 via the first control node NO3.

The level at one side of the second boost capacitor 1Cb2 of the first boosting unit 200 is raised by the increased voltage. According to the law of conservation of electric charge, the level at the other side of the second boost capacitor 1Cb2 of the first boosting unit 200 is also raised from the initialized internal voltage VINT by the increased voltage, such that a boosted voltage is generated by the pumping operation.

Since the boosted voltage applied to the gate terminal of the initialization control transistor 1N_inc of the first initialization unit 100 is higher than a difference between a gate voltage and a threshold voltage, the initialization control transistor 1N_inc of the first initialization unit 100 is turned on and the initialization transistor 1N_in is turned off by the internal voltage VINT being applied to its gate terminal.

The first transfer transistor 1P_tr1 of the first transfer unit 300 receives a voltage having the low level given by inverting the positive input voltage VIN through its gate terminal and is turned on. The second transfer transistor 1P_tr2 of the first transfer unit 300 receives the negative input voltage VINB having the low level through its gate terminal and is turned on. The pumped boosted voltage is transferred from a first boost node NO1 to the output unit 700 and is charged in the output capacitor Co. Simultaneously, the pumped boosted voltage VOUT is externally output via an output node NO5.

In contrast, when the positive input voltage VIN is increased, the negative input voltage VINB is proportionately decreased to the low level. One side of the first boost capacitor 2Cb1 of the second boosting unit 500 is grounded and, simultaneously, the negative input voltage VINB inverted to the high level by the inverter IN2 is applied to the gate terminal of the initialization transistor 2N_in of the second initialization unit 400 via a second control node NO4.

Accordingly, the initialization transistor 2N_in of the second initialization unit 400 is turned on and the internal voltage VINT is transferred to the other side of the grounded first boost capacitor 2Cb1 of the second boosting unit 500, such that the second input terminal side is initialized.

As described above, the first and second initialization units 100 and 400, the first and second boosting units 200 and 500, and the first transfer transistors 1P_tr1 and 2P_tr1 of the first and second transfer units 300 and 600 operate as conventional NMOS voltage doublers. The second transfer transistors 1P_tr2 and 2P_tr2 of the first and second transfer units 300 and 600 operate as conventional cross-coupled types. When the pumping operation is performed at one side of the two input terminals, the initialization operation is performed at the other side. Conversely, when the initialization operation is performed at the one side, the pumping operation is performed at the other side. The charge pump circuit according to the example embodiment of the present invention can overcome all drawbacks while retaining the merits of the two conventional types.

For example, when overlap occurs since the positive input voltage VIN does not transition to the low level due to a signal delay and the negative input voltage VINB transitions to the high level, both the first and second boost nodes NO1 and NO2 are maintained at the high level. When the first transfer transistors 1P_tr1 and 2P_tr1 of the first and second transfer units 300 and 600 are turned on and the second transfer transistors 1P_tr2 and 2P_tr2 of the first and second transfer units 300 and 600 are turned off, an output voltage path is separated and the possibility of leakage current is lowered, such that a stable output voltage VOUT is maintained.

When overlap occurs since the positive input voltage VIN does not transition to the high level due to a signal delay and the negative input voltage VINB transitions to the low level, the first and second boost nodes NO1 and NO2 are initialized to the internal voltage VINT, the first transfer transistors 1P_tr1 and 2P_tr1 of the first and second transfer units 300 and 600 are turned off, and the second transfer transistors 1P_tr2 and 2P_tr2 are turned on. The electric charge stored in the output capacitor Co of the output unit 700 can be prevented from flowing backward to the first and second boost nodes NO1 and NO2.

In contrast, even when a time when the positive input voltage VIN transitions from the high level to the low level overlaps a time when the negative input voltage VINB transitions from the low level to the high level, an output voltage path is separated and the possibility of leakage current occurrence is lowered, such that the stable output voltage VOUT is maintained.

Consequently, the output voltage VOUT is maintained at the pumped boosted voltage by preventing leakage current. The positive input voltage VIN and the negative input voltage VINB can be simultaneously maintained at the low level. Since degradation of transistor characteristics due to a high electric field occurs in the same object on paths of both the input voltages VIN and VINB, mismatch due to degradation does not occur even in the standby state of a semiconductor circuit.

The charge pump circuit according to the example embodiment of the present invention can overcome the limitation of an output voltage occurring in the conventional NMOS voltage-doubler type charge pump and the problem of leakage current and the limitation in use due to continuation of a standby state occurring in the conventional cross-coupled charge pump circuit.

All of the first and second transfer transistors 1P_tr1, 1P_tr2, 2P_tr1, and 2P_tr2 of the first and second transfer units 300 and 600 are PMOS transistors. Accordingly, the following limitations are present when bulk terminals of the transfer transistors are directly connected to the output node NO5 of the output unit 700, as shown in FIG. 3A.

In general, when the PMOS transistor has a high source voltage and a low bulk voltage, a bipolar junction transistor formed with a source, a bulk, and a P-type substrate reaches a turn-on condition. Accordingly, the electric charge of the source terminal is not transferred to the drain terminal and flows into the P-type substrate, such that the effect of bulk forward bias occurs. When the bulk forward-bias effect is serious, a latch-up effect capable of destroying a semiconductor chip can be caused by an overcurrent of the output stage. These effects may be problematic when electricity consumption of the output unit 700 is suddenly increased and a voltage thereof is decreased.

In order to overcome the limitations of the PMOS transistor, the charge pump circuit according to the example embodiment of the present invention includes the first and second bulk bias units 350 and 650 having the same configuration and function as the first and second transfer units 300 and 600 shown in FIG. 3B. The electric charge of the source terminal is transferred to the drain terminal without flowing into the P-type substrate by increasing the voltages of bulk terminals of the first and second transfer transistors 1P_tr1, 1P_tr2, 2P_tr1, and 2P_tr2 of the first and second transfer units 300 and 600 by a predetermined level, such that the bulk forward-bias effect and the latch-up effect can be prevented.

Figure 4A:
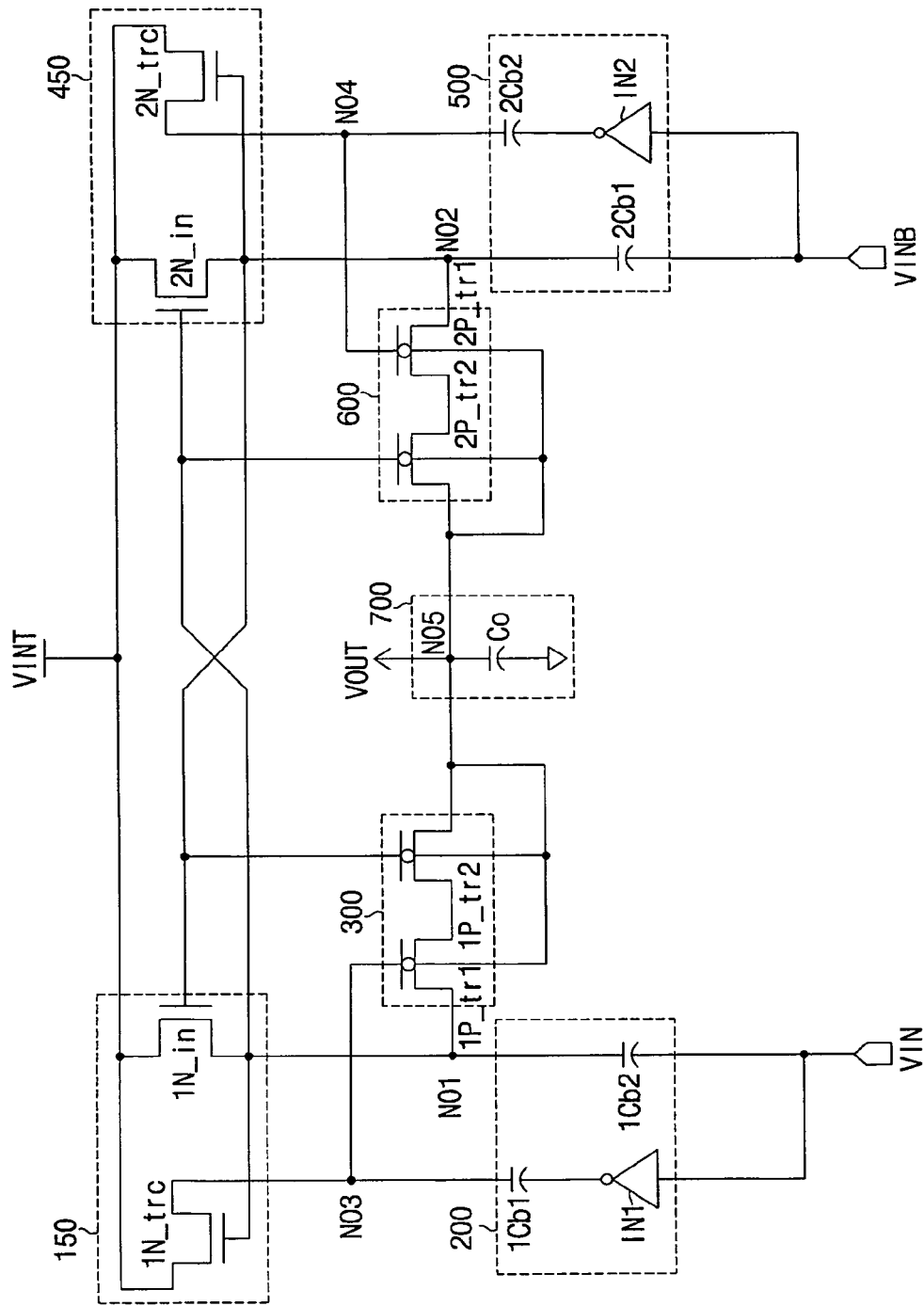
FIG. 4A is a conceptual circuit diagram of a charge pump circuit according to another example embodiment of the present invention.

FIG. 4A is a conceptual circuit diagram of a charge pump circuit according to another example embodiment of the present invention.

The charge pump circuit includes first and second initialization units 150 and 450 configured with initialization transistors 1N_in and 2N_in and transfer control transistors 1N_trc and 2N_trc; first and second boosting units 200 and 500 configured with first and second boost capacitors 1Cb1, 1Cb2, 2Cb1, and 2Cb2 and inverters IN1 and IN2; first and second transfer units 300 and 600 configured with first and second transfer transistors 1P_tr1, 1P_tr2, 2P_tr1, and 2P_tr2; and an output unit 700 configured with an output capacitor Co. The initialization transistors 1N_in and 2N_in and the transfer control transistors 1N_trc and 2N_trc are NMOS transistors. The first and second transfer transistors 1P_tr1, 1P_tr2, 2P_tr1, and 2P_tr2 are PMOS transistors.

Figure 4B:
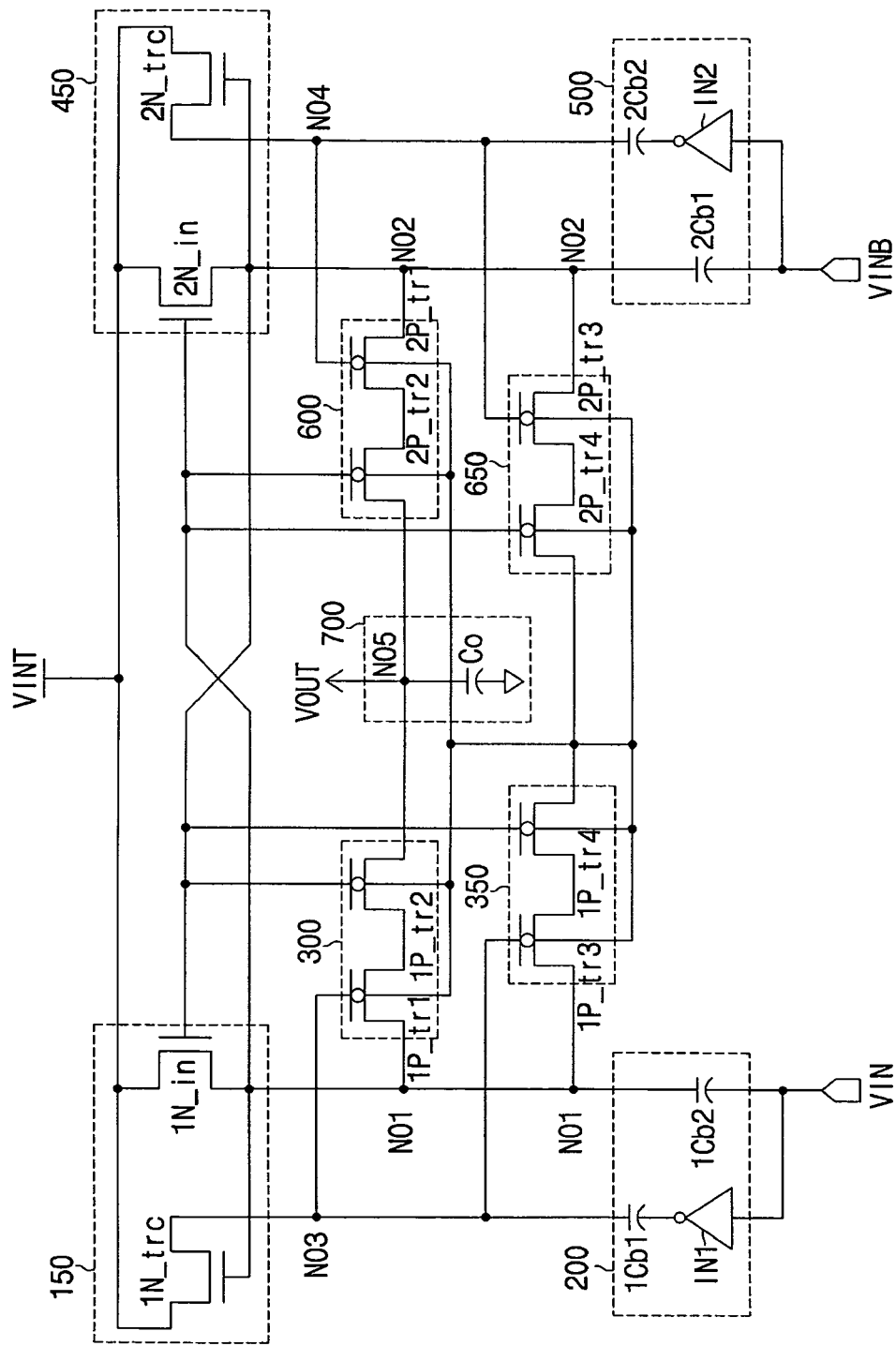
FIG. 4B is an actual circuit diagram of a charge pump circuit according to another example embodiment of the present invention.

FIG. 4B is an actual circuit diagram of a charge pump circuit according to another example embodiment of the present invention. The charge pump circuit includes first and second bulk bias units 350 and 650 configured with third and fourth transfer transistors 1P_tr3, 1P_tr4, 2P_tr3, and 2P_tr4 added to the conceptual charge pump circuit of FIG. 4A.

The charge pump circuit of FIGS. 4A and 4B is different from that of FIGS. 3A and 3B in that the first and second initialization units 150 and 450 have the transfer control transistors 1N_trc and 2N_trc in place of the initialization control transistors 1N_inc and 2N_inc, and the gate terminals of the initialization transistors 1N_in and 2N_in of the first and second initialization units 150 and 450 are respectively connected to the negative input voltage VINB and the positive input voltage VIN such that each of the first and second initialization units 150 and 450 is initialized by control of the input voltage at an opposite side.

Functions of the first and second boosting units 200 and 500, the first and second transfer units 300 and 600, the first and second bulk bias units 350 and 650, and the output unit 700 within the charge pump circuit according to the present example embodiment of the present invention are the same as in the charge pump circuit according to the example embodiment of the present invention shown in FIGS. 3A and 3B. In the first and second initialization units 150 and 450, the transfer control transistors 1N_trc and 2N_trc control an operation for turning on or off the first transfer transistors 1P_tr1 and 2P_tr1. Each of the first and second initialization units 150 and 450 receives the internal voltage VINT and initializes it from ground to the internal voltage VINT in response to an input voltage at an opposite side of two input voltages having opposite phases.

Next, operation of the charge pump circuit according to the second example embodiment of the present invention will be described with reference to FIGS. 4A and 4B.

When a positive input voltage VIN having a low level is initially applied to a first input terminal, one side of the second boost capacitor 1Cb2 of the first boosting unit 200 is grounded. The positive input voltage VIN is phase-inverted to the high level by the inverter IN1 and is applied to one side of the first boost capacitor 1Cb1 of the first boosting unit 200. The phase-inverted voltage is applied to the source/drain terminal of the transfer control transistor 1N_trc of the first initialization unit 150 via a first control node NO3. A negative input voltage VINB having a high level is input to a second input terminal and applied to the gate terminal of the initialization transistor 1N_in of the first initialization unit 150.

Accordingly, the initialization transistor 1N_in of the first initialization unit 150 is turned on and the internal voltage VINT is transferred to the other side of the second boost capacitor 1Cb2 of the first boosting unit 200, such that the first input terminal side is initialized.

At this time, the first transfer transistor 1P_tr1 of the first transfer unit 300 receives the positive input voltage VIN having the high level through its gate terminal and is turned off. The second transfer transistor 1P_tr2 of the first transfer unit 300 receives the negative input voltage VINB having the high level through its gate terminal and is turned off.

When the initialization transistor 1N_in of the first initialization unit 150 is turned off and the positive input voltage VIN is increased after the initialization of the first input terminal side, the phase is inverted to the low level by the inverter IN1. The phase-inverted voltage is applied to one side of the first boost capacitor 1Cb1 of the first boosting unit 200, and to the source/drain terminal of the transfer control transistor 1N_trc of the first initialization unit 150 and the gate terminal of the first transfer transistor 1P_tr1 of the first transfer unit 300 via the first control node NO3. The negative input voltage VINB having the low level is input to the second input terminal and is applied to the gate terminal of the second transfer transistor 1P_tr2 of the first transfer unit 300.

The level at one side of the second boost capacitor 1Cb2 of the first boosting unit 200 is raised by the increased voltage. According to the law of conservation of electric charge, the level at the other side of the second boost capacitor 1Cb2 of the first boosting unit 200 is also raised from the initialized internal voltage VINT by the increased voltage, such that a boosted voltage is generated by the pumping operation.

Since all of the first and second transfer transistors 1P_tr1 and 1P_tr2 of the first transfer unit 300 are turned on, the pumped boosted voltage is transferred to the output unit 700 and charged in the output capacitor Co. Simultaneously, the pumped boosted voltage VOUT is externally output via an output node NO5.

In contrast, when the positive input voltage VIN is increased, the negative input voltage VINB is proportionately decreased to the low level. One side of the first boost capacitor 2Cb1 of the second boosting unit 500 is grounded and, simultaneously, the negative input voltage VINB inverted to the high level by the inverter IN2 is applied to the source/drain terminal of the transfer control transistor 2N_trc of the second initialization unit 450 via a second control node NO4. The pumped boosted voltage is applied from the second boost capacitor 1Cb2 of the first boosting unit 200 to the gate terminal of the initialization transistor 2N_in of the second initialization unit 450.

Accordingly, the initialization transistor 2N_in of the second initialization unit 450 is turned on and the internal voltage VINT is transferred to the other side of the grounded first boost capacitor 2Cb1 of the second boosting unit 500, such that the second input terminal side is initialized.

As described above, the first and second initialization units 150 and 450, the first and second boosting units 200 and 500, and the first transfer transistors 1P_tr1 and 2P_tr1 of the first and second transfer units 300 and 600 operate as conventional NMOS voltage-doublers. The second transfer transistors 1P_tr2 and 2P_tr2 of the first and second transfer units 300 and 600 operate as conventional cross-coupled types. When the pumping operation is performed at one side of the two input terminals, the initialization operation is performed at the other side. Conversely, when the initialization operation is performed at the one side, the pumping operation is performed at the other side. In the charge pump circuit according to the second example embodiment of the present invention, the voltages of the first and second boosting units 200 and 500 may be pumped and discharged to an internal voltage VINT source side. This forms only a slight leakage current in an internal terminal and does not affect the electric charge to be transferred to the output stage. Consequently, the charge pump circuit according to the second example embodiment of the present invention can overcome all drawbacks while retaining the merits of the two conventional types.

For example, when overlap occurs since the positive input voltage VIN does not transition to the high level to a signal delay and the negative input voltage VINB transitions to the low level, the first and second boost nodes NO1 and NO2 are initialized to the internal voltage VINT. When the first transfer transistors 1P_tr1 and 2P_tr1 of the first and second transfer units 300 and 600 are turned off and the second transfer transistors 1P_tr2 and 2P_tr2 are turned on, the electric charge stored in the output capacitor Co of the output unit 700 can be prevented from flowing backward to the first and second boost nodes NO1 and NO2.

In contrast, when overlap occurs since the positive input voltage VIN does not transition to the low level due to a signal delay and the negative input voltage VINB transitions to the high level, all of the first and second boost nodes NO1 and NO2 are maintained at the high level. When the first transfer transistors 1P_tr1 and 2P_tr1 of the first and second transfer units 300 and 600 are turned on and the second transfer transistors 1P_tr2 and 2P_tr2 are turned off, an output voltage path is separated. When the transfer control transistors 1N_trc and 2N_trc of the first and second initialization units 150 and 450 are turned on, the electric charges of the first and second boosting units 200 and 500 are discharged to the internal voltage VINT source, such that a leakage current may occur.

However, the leakage current is less than that when the first and second initialization transistors 1N_in and 2N_in are turned on and the electric charge stored in the output capacitor Co is discharged in the conventional cross-coupled charge pump circuit. The efficiency of the charge pump circuit is slightly lowered, but the pumped boosted voltage can be maintained at the output voltage VOUT. In comparison with the example embodiment of the present invention in which the initialization control transistors 1N_inc and 2N_inc and the initialization transistors 1N_in and 2N_in are connected to the gate terminals of the first transfer transistors 1P_tr1 and 2P_tr1, the second example embodiment of the present invention in which only the first transfer transistors 1P_tr1 and 2P_tr1 are connected thereto can reduce a load.

In contrast, even when a time when the positive input voltage VIN transitions from the high level to the low level overlaps a time when the negative input voltage VINB transitions from the low level to the high level, an output voltage path is separated and the possibility of leakage current occurrence is lowered, such that the stable output voltage VOUT is maintained.

The positive input voltage VIN and the negative input voltage VINB can be simultaneously maintained at the low level. Since degradation of transistor characteristics due to a high electric field occurs on paths of both the input voltages VIN and VINB, no mismatch is caused by the degradation even in the standby state of a semiconductor circuit.

The charge pump circuit according to the second example embodiment of the present invention can overcome the limitation of an output voltage occurring in the conventional NMOS voltage-doubler type charge pump and the problem of leakage current and the limitation in use due to continuation of a standby state occurring in the conventional cross-coupled charge pump circuit.

As in the example embodiment of the present invention, all of the first and second transfer transistors 1P_tr1, 1P_tr2, 2P_tr1, and 2P_tr2 of the first and second transfer units 300 and 600 are PMOS transistors. Accordingly, if bulk terminals of the transfer transistors are directly connected to the output node NO5 of the output unit 700 as shown in FIG. 4A, the bulk forward-bias effect and the latch-up effect may occur when the source voltage of the PMOS transistor is high and the bulk voltage is low.

In order to overcome the limitations of the PMOS transistor, the charge pump circuit according to the second example embodiment of the present invention includes the first and second bulk bias units 350 and 650, as shown in FIG. 4B. The bulk forward-bias effect and the latch-up effect can be prevented by increasing the voltages of bulk terminals of the first and second transfer transistors 1P_tr1, 1P_tr2, 2P_tr1, and 2P_tr2 of the first and second transfer units 300 and 600 by a predetermined level.

In the above-described example embodiments, all of the first and second transfer transistors 1P_tr1, 1P_tr2, 2P_tr1, and 2P_tr2 of the first and second transfer units 300 and 600 are PMOS transistors. However, a problem of a leakage current in an output stage and mismatch due to degradation in the conventional cross-couple charge pump circuit can be overcome by configuring the first transfer transistors 1P_tr1 and 2P_tr1 with NMOS transistors and inversely applying phases of the gate terminals for controlling the NMOS transistors and the initialization transistors 1N_in and 2N_in.

According to example embodiments of the present invention, a charge pump circuit can improve current supply capability by generating a boosted voltage without limiting an output voltage, and can easily adjust an internal voltage and the timing at which a target boosted voltage is output in a multi-stage charge pump structure.

Moreover, the charge pump circuit can prevent leakage current even when waveforms of two input voltages having opposite phases cross or overlap, and can improve the performance of a semiconductor circuit by preventing mismatch due to degradation of transistor characteristics due to a strong electric field.

While the present invention has been shown and described in connection with example embodiments thereof, it will be apparent to those skilled in the art that various modifications can be made without departing from the spirit and scope of the invention as defined by the appended claims.

What is claimed is:

1. A charge pump circuit comprising:
   initialization units each initializing a boost node to an initialization voltage upon initialization;
   boosting units each boosting the boost node to a higher voltage than the initialization voltage in response to an input voltage upon charge pumping; and
   first and second pump circuits each including a transfer unit for transferring a voltage of the boost node to an output node and sharing the output node,
   wherein the transfer unit of the first pump circuit comprises two transfer transistors that are serially connected between the boost node of the first pump circuit and the output node and switched in response to a voltage of a control node of the first pump circuit and the voltage of the boost node of the second pump circuit, and
   the transfer unit of the second pump circuit comprises two transfer transistors that are serially connected between the boost node of the second pump circuit and the output node and switched in response to a voltage of a control node of the second pump circuit and the voltage of the boost node of the first pump circuit.

2. The charge pump circuit of claim 1, further comprising:
   bulk bias units each preventing bulk forward-bias effect of a P-type Metal-Oxide-Semiconductor (PMOS) transistor by raising a bulk voltage of the transfer unit by a predetermined level; and
   an output unit that charges a boosted voltage in an output capacitor by receiving the boosted voltage from the boosting unit and simultaneously externally outputs the boosted voltage.

3. The charge pump circuit of claim 2, wherein each of the initialization units comprises:
   an initialization transistor that is turned on in response to an initially inverted input voltage and initializes the boost node by transferring the initialization voltage to the boost node; and
   an initialization control transistor that is turned on in response to the voltage of the boost node and controls the initialization transistor to be turned on or off by applying the initialization voltage to a control terminal of the initialization transistor.

4. The charge pump circuit of claim 3, wherein each of the boosting units comprises:
   an inverter that inverts a voltage by receiving the input voltage;
   a first boost capacitor that receives and charges the inverted input voltage and controls the initialization transistor to be turned on or off by applying the charged input voltage to the control terminal of the initialization transistor; and
   a second boost capacitor that receives and charges the input voltage at a first side of the second boost capacitor, and charge-pumps a voltage at a second side of the second boost capacitor from the initialization voltage to the boosted voltage raised by an increased voltage.

5. The charge pump circuit of claim 4, wherein the second boost capacitor raises the voltage at the second side of the second boost capacitor by the increased voltage from the initialization voltage according to the law of conservation of electric charge when the voltage at the first side of the second boost capacitor is raised by the increased voltage if the input voltage is increased.

6. The charge pump circuit of claim 5, wherein the transfer unit comprises:
   a first transfer transistor that is turned on in response to the voltage of the control node and transfers the voltage of the boost node; and
   a second transfer transistor that is turned on in response to the voltage of the boost node of an opposite pump circuit of the first and second pump circuits and transfers the voltage of the boost node from the first transfer transistor to the output unit.

7. The charge pump circuit of claim 6, wherein the first and second transfer transistors are PMOS transistors.

8. The charge pump circuit of claim 7, wherein the first transfer transistor is an N-type Metal-Oxide-Semiconductor (NMOS) transistor to control a phase of the input voltage to be inverted.

9. The charge pump circuit of claim 8, wherein each of the bulk bias units comprises:
   a third transfer transistor that is turned on in response to the voltage of the control node and transfers the voltage of the boost node; and
   a fourth transfer transistor that is turned on in response to a voltage of a boost node of an opposite pump circuit of the first and second pump circuits and transfers the voltage of the boost node from the third transfer transistor to bulk terminals of the first and second transfer transistors.

10. The charge pump circuit of claim 9, wherein the third and fourth transfer transistors are PMOS transistors.

11. The charge pump circuit of claim 10, wherein the third transfer transistor is an NMOS transistor to control a phase of the input voltage to be inverted.

12. The charge pump circuit of claim 11, wherein in the first and second pump circuits, one of the first and second pump circuits performs a charge pumping operation to the boosted voltage when the other of the first and second pump circuits performs an initialization operation, and the one of the first and second pump circuits performs the initialization operation when the other of the first and second pump circuits performs the charge pumping operation to the boosted voltage.

13. The charge pump circuit of claim 12, wherein input voltages have opposite phases when the charge pumping operation to the boosted voltage is performed, and have the same phase in a standby state.

14. The charge pump circuit of claim 13, wherein when overlap occurs since one of the input voltages does not transition to a low level and the other of the input voltages transitions to a high level, the first transfer transistor of the transfer unit is turned on and the second transfer transistor is turned off, thereby preventing electric charge stored in the output capacitor from leaking to the boost node.

15. The charge pump circuit of claim 14, wherein when the overlap occurs since the one of the input voltages does not transition to the high level and the other of the input voltages transitions to the low level, the first transfer transistor of the transfer unit is turned off and the second transfer transistor is turned on, thereby preventing electric charge stored in the output capacitor from leaking to the boost node.

16. The charge pump circuit of claim 15, wherein when a time when one of two input voltages transitions from the high level to the low level overlaps a time when the other of the two input voltages transitions from the low level to the high level, the transfer unit prevents the electric charge stored in the output capacitor from leaking to the boost node by setting turn-on times of the first and second transfer transistors to be different from each other.

17. The charge pump circuit of claim 2, wherein each of the initialization units comprises:

an initialization transistor that is initially turned on in response to the voltage of the boost node of an opposite pump circuit of the first and second pump circuits and initializes the boost node by transferring the initialization voltage; and a transfer control transistor that is turned on in response to the voltage of the boost node and controls a transfer of the voltage of the boost node by transferring the initialization voltage to the transfer unit.

* * * * *